(12) United States Patent
Phillips et al.

(10) Patent No.: US 8,014,192 B2
(45) Date of Patent: Sep. 6, 2011

(54) METHOD AND DEVICE TO DETECT THE LIKELY ONSET OF THERMAL RELAXATION IN MAGNETIC DATA STORAGE DEVICES

(75) Inventors: Gavin Nicholas Phillips, Eindhoven (NL); Hans Marc Bert Boeve, Eindhoven (NL)

(73) Assignee: NXP B.V., Eindhoven (NL)

( * ) Notice: Subject to any disclaimer, the term of this patent is extended or adjusted under 35 U.S.C. 154(b) by 960 days.

(21) Appl. No.: 10/536,291

(22) PCT Filed: Nov. 6, 2003

(86) PCT No.: PCT/IB03/05018
§ 371 (c)(1),
(2), (4) Date: May 25, 2005

(87) PCT Pub. No.: WO2004/049343
PCT Pub. Date: Jun. 10, 2004

(65) Prior Publication Data
US 2006/0018148 A1    Jan. 26, 2006

(30) Foreign Application Priority Data

Nov. 28, 2002    (EP) ..................................... 02080007

(51) Int. Cl.
*G11C 11/00*    (2006.01)
(52) U.S. Cl. .......................... 365/158; 365/171; 365/173
(58) Field of Classification Search .................. 365/158, 365/171, 173
See application file for complete search history.

(56) References Cited

U.S. PATENT DOCUMENTS

| | | | | |
|---|---|---|---|---|
| 5,068,826 A | * | 11/1991 | Matthews | ...................... 365/170 |
| 6,426,907 B1 | | 7/2002 | Hoenigschmid | |
| 6,724,674 B2 | * | 4/2004 | Abraham et al. | ............. 365/211 |
| 6,839,271 B1 | * | 1/2005 | Anthony et al. | ............. 365/158 |
| 2001/0012228 A1 | | 8/2001 | Perner | |

* cited by examiner

*Primary Examiner* — Pho M Luu (57) ABSTRACT

Reference magnetic elements or bits with a range of magnetic volumes smaller than the minimum size used for actual data storage are written or patterned in the data storage device. The reference elements or bits have dimensions such that their magnetization will relax in a shorter time than that of the minimum expected relaxation time of the storage elements or bits. Probing of the magnetization of the reference elements or bits allows the detection of the probable onset of magnetization relaxation in the storage elements or bits therefore signaling that the re-writing (re-magnetizing) of the storage elements or bits is necessary. Such a scheme can be organized over rows, columns, or sectors.

15 Claims, 7 Drawing Sheets

METHOD AND DEVICE TO DETECT THE LIKELY ONSET OF THERMAL RELAXATION IN MAGNETIC DATA STORAGE DEVICES

The present invention relates to magnetic memory or data storage devices, in particular to such magnetic memory devices with small size magnetic elements, i.e. in the order of 100 nm and smaller. In particular the present invention relates to a method and a device to detect the likely onset of thermal relaxation in magnetic data storage devices.

The use of magnetic materials in data storage devices is well established, either as the data storage medium (hard disk, magneto-optic disk, floppy disk, tape, MRAM data storage layer/element, etc.), read-back sensor (MR, GMR, TMR hard disk heads, MRAM sense elements, etc.) or write elements (hard disk, magneto-optic disk, floppy disk and tape write head flux guides, etc.).

Recently, in the area of hard disk recording, areal density (or bit density), i.e. the amount of data that can be stored in one unit square (e.g. centimeter$^2$) of surface area of recording medium, has become the most significant factor in the rapid evolution of magnetic storage devices. A dramatic reduction of the bit (and thus magnetic domain) size has been realized in order to increase data capacity. The signal to noise ratio of a recording medium is strongly related to the number of grains. As bit sizes are scaled down to increase areal densities, the average grain volume in each bit of the medium is also being reduced in order to maintain enough grains per bit to ensure an acceptable signal to noise ratio.

Generally, the magnetization of a magnet decays with time, due to random thermal fluctuations ($k_B T$), sometimes in conjunction with the effect of an external field, overcoming the magnetic (anisotropy) energy ($K_u V$) of the material. For non-interacting particles (as in hard disk media or MRAM storage elements) this becomes a serious problem when the volume becomes small enough for the thermal energy to become equal to or greater than the magnetic energy—at this point the particle becomes super-paramagnetic, i.e. the magnetization of the particle switches randomly over short time scales. At the super-paramagnetic limit, the magnetic particles are so small that they cannot maintain a stable magnetization for any practically useful amount of time, which results in data loss. This physical limit depends upon temperature and the physical and structural properties of the magnetic material. Bit or memory element (and thus magnetic domain) sizes cannot be reduced indefinitely as a physical limit, the above-mentioned super-paramagnetic limit, exists for the smallest magnetically stable volume. The grain magnetization being susceptible to thermal agitation leads to a reduced signal to noise ratio (in hard disks) and eventual loss of data (in both hard disks and MRAM as bits or memory elements effectively "self-erase". Using materials with large intrinsic anisotropy constants, or large shape anisotropies (e.g. elongated ellipsoids), can delay the onset of this super-paramagnetic limit.

In the area of hard disk recording, several strategies may be used to enhance the thermal stability of the data storage medium.

As a first strategy, anti-ferromagnetically coupled (AFC) media have recently been described by Fujitsu and IBM, E. Abarra et al., "Longitudinal recording media with thermal stabilization layers", J. Appl. Phys. Lett. 77, (2000) p. 2581; E. Fullerton et al., "Antiferromagnetically coupled magnetic media layers for thermally stable high-density recording", J. Appl. Phys. Lett. 77, (2000) p. 3806. Such a medium, called a synthetic anti-ferromagnetic medium (AFC), consists of two conventional crystalline data storage layers of different thickness and possessing in-plane magnetic anisotropy, that are exchange coupled through a thin Ru interlayer. This approach stabilizes the medium against thermal fluctuations by effectively increasing the effective magnetic volume of each bit.

The use of media possessing perpendicular magnetic anisotropy also increases thermal stability as media with large uniaxial anisotropy energies may be engineered, as described in K Ouchi, "Recent Advancements in Perpendicular Magnetic Recording", IEEE Tran. Magn. 37 (2001) p. 1217. Furthermore, thicker magnetic layers, resulting in larger bit magnetic volumes, may be used with perpendicular recording schemes.

A third strategy is to switch to using patterned media consisting of small physically separated magnetic islands, usually possessing perpendicular magnetic anisotropy. If of suitable dimensions, such islands will possess a high shape anisotropy, or be too small to support magnetic domains, and hence exhibit an enhanced thermal stability. This is described in M. Albrecht et al., "Thermal stability and recording properties of sub-100 nm patterned CoCrPt perpendicular media", J. Appl. Phys. Lett. 91 (2002), p. 6849.

Small magnetic islands are also required for the memory elements of MRAM devices. Again the thermal stability of such elements may be enhanced by the use of magnetic materials possessing high intrinsic magnetic anisotropy, or by engineering the shape of the magnetic islands such that they possess a large shape anisotropy.

Whichever of the above-mentioned stabilization strategies are used, both magnetic data storage media and MRAM will eventually succumb to the above-mentioned super-paramagnetic limit.

Both MRAM data storage elements and magnetic recording media are subject to the super-paramagnetic limit that defines the minimum size of thermo-magnetically stable data storage elements, islands or bits written into continuous films. Given that such a situation cannot easily be avoided, sub-optimally dimensioned memory element or bits possessing a magnetic volume substantially larger than the minimum defined by the superparamagnetic limit, have to be refreshed, or re-written, at fixed intervals of time. The magnetic volumes have to be substantially larger than the super-paramagnetic limit in order to include tolerances that will compensate for the statistical variation in element or bit size and the random nature of thermal fluctuations. This results in a limited data capacity, increased power consumption and forced memory "down time" during refresh operations.

It is an object of the present invention to provide a method and a device that allows the use of magnetic elements or bits with the smallest possible dimensions, thus maximizing data capacity, that will have their magnetizations refreshed at appropriate times, thus minimizing power consumption and memory down time.

The above objective is accomplished by a device and method according to the present invention. The present invention provides a magnetic relaxation simulator which can be used to estimate when magnetic elements used for storing data need refreshing.

The simulator may comprise an array, or number of arrays, of reference magnetic elements or bits with a single size or magnetic volume, or with a range of sizes or magnetic volumes, which are written or patterned in a data storage device (SAM memory array or magnetic medium). The reference magnetic elements or bits may possess a range or distribution in sizes or magnetic volumes in order to reflect the statistical range or distribution in sizes and magnetic characteristics, including physical inhomogeneities, of the actual memory elements or bits in which data is stored. The reference elements or bits are such that their magnetization will relax due to thermal fluctuations in a shorter time than the minimum expected relaxation time of the storage elements or bits which will be used for storing true data For example, the reference magnetic elements may be deliberately engineered to be smaller than the minimum size of memory elements used for actual data storage. The magnetic volume of a storage element may for example relate to its aspect ratio or to its area.

Probing of the magnetization of the reference elements or bits will allow the detection of the probable onset of magnetization relaxation in the storage elements or bits for storing data therefore signaling that the re-writing or refreshing (re-magnetizing) of the storage elements or bits is necessary. Such a scheme can be organized with reference arrays coupled to rows, columns, or sectors, for example.

The magnetic relaxation simulator may also be virtual in form, comprising a predictive model programmed into a processing element within the data storage device. Preferably the model is of sufficient complexity to predict the actual behavior of a "hardware" simulator, e.g. a simulator with reference storage elements as described in the previous paragraph. Obtaining that complexity may be dependent upon knowing the actual physical and operational characteristics of the storage magnetic elements or bits to a sufficient level of accuracy as initial input data for the model. In addition, the model may have to be structured in such a way as to simulate the physical processes that occur within a "hardware" simulator to a very high level of accuracy. Such a virtual simulator may require a large processing overhead, or extremely fast processing infrastructure in order to run in "real time". Such requirements may be relaxed if a simplified model is used to simulate the "hardware" simulator with sufficient accuracy to be used in practice.

As an alternative, an extremely accurate virtual simulator can be run "off-line", not in real time, and the results can be stored in the data storage device in such a way as to be accessible by the device in order to control the operation of the device.

A virtual simulator can also be used in tandem with a hardware simulator within the data storage device. A further variation is to use a hardware simulator in combination with the results of a more complex virtual simulator, that have been stored in an accessible manner within the data storage device.

The present invention provides a magnetic memory device comprising an array of magnetic storage elements for data storage. The memory is furthermore provided with a magnetic relaxation simulator as described above, for simulating the onset of thermal relaxation of the magnetic storage elements. The memory may be a magnetic data storage device such as e.g. MRAM, a magnetic disk device, a magneto-optic disk device, a magnetic tape device or a probe based device.

The magnetic storage elements of the memory device may be contained within a continuous thin film of magnetic material. According to an embodiment, they may be defined by a continuous thin film of magnetic material that has been patterned into individual elements. According to another embodiment, they may be defined by the forming of individual magnetic elements within a pre-defined patterned structure.

The present invention also provides a method to determine likely onset of thermal relaxation in a magnetic data storage device. The method comprises simulating the onset of thermal relaxation of the magnetic storage elements.

If the magnetic storage device comprises data storage elements and reference magnetic storage elements, the simulation may proceed by comparing the magnetization states of reference magnetic storage elements as a measure of the thermal stability of at least one of the reference magnetic storage elements in the magnetic storage device.

Alternatively, the simulation may be done by predicting the thermal relaxation of magnetic storage elements on the basis of an established relationship between the thermal relaxation of magnetic storage elements and physical processes that occur thereto, such as magnetization switching due to writing of values.

The present invention also provides the use of a method to determine likely onset of thermal relaxation in a magnetic data storage device for deciding whether or not to refresh data storage elements. This may be done when programming data storage elements.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Magnetic or Magnetoresistive Random Access Memory (MRAM is currently being considered by many companies as a successor to flash memory. It has the potential to replace all but the fastest static RAM (SRAM) memories. It is a non-volatile memory device, which means that no power is required to sustain the stored information. This is seen as an advantage over most other types of memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize e.g. non-volatile magnetic memories. These devices comprise a stack of thin films of which at least two are ferromagnetic or ferrimagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferrimagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferrimagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 6-9% magneto-resistance in good GMR cells.

Figure 1:
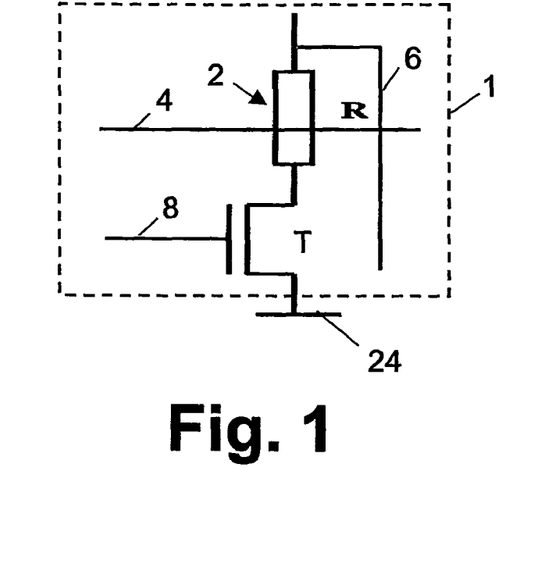
FIG. 1 is an electrical representation of an MRAM unit for connection in an array.

As an example only, the present invention is applied to an MRAM. An MRAM comprises a plurality of magnetoresistive memory units 1 arranged in an array. One such memory unit 1 is shown in FIG. 1. Each memory unit 1 comprises a magnetoresistive memory element 2, a first intersection of a digit line 4 and a bit line 6, and a second intersection of bit line 6 and a word line 8. The memory units 1 are coupled in series in columns by means of the bit lines 6 and coupled in series in rows by means of the digit lines 4 and word lines 8, thus forming the array. The magnetoresistive memory elements 2 used may for example, but not limited thereto, be magnetic tunnel junctions (MTJs).

An MTJ memory element 2 is used by connecting it in a circuit such that electricity can flow vertically through the element 2 from one of the magnetic layers to the other. The MTJ unit 1 can be electrically represented by a resistor R in series with a switching element such as a transistor T, as shown in FIG. 1. The size of the resistance of the resistor R depends on the orientation of the magnetic vectors of the free and pinned magnetic layers of the memory element 2. The MTJ element 2 has a relatively high resistance (HiRes) when the magnetic vectors point in opposite directions, and it has a relatively low resistance (LoRes) when the magnetic vectors point in the same direction.

Figure 2:
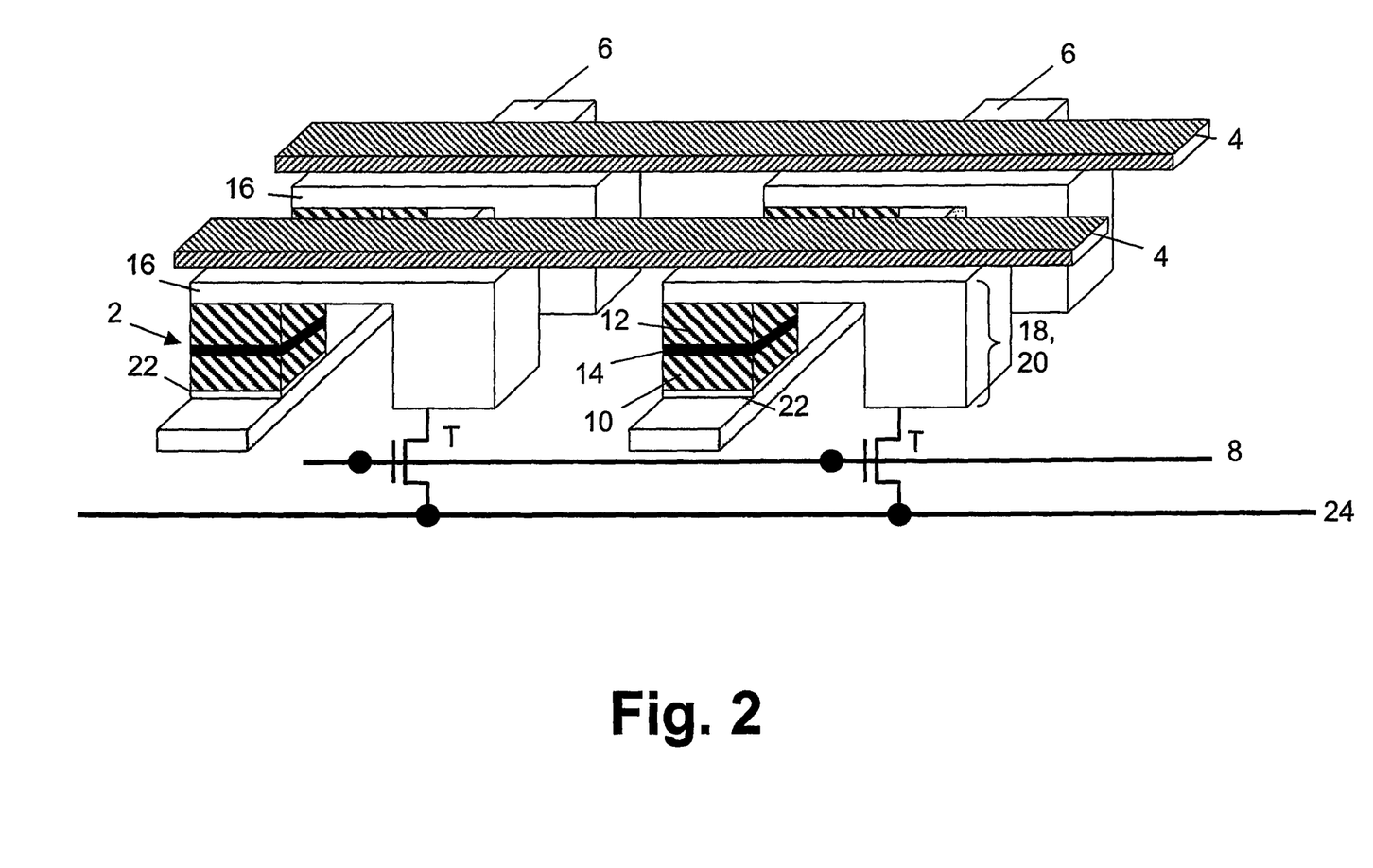
FIG. 2 is a diagrammatic elevational view of a 2×2 array of MTJ units.

A diagrammatic elevational view of a 2×2 array of prior art memory units is shown in FIG. 2. In an MRAM array, comprising a plurality of MRAM units, orthogonal conductive lines 4, 6 pass under and over each bit or memory element 2, carrying current that produces a switching field. Each bit is designed so that it will not switch when current is applied to just one line, but will switch when current is flowing through both lines that cross at the selected bit (switching will occur only if the magnetic vector of the free layer is not in accordance with the direction of the switching field).

Digit lines 4 and bit lines 6 are provided in an array of MTJ memory units 1, where the digit lines 4 travel along the rows of the array on one side of the memory elements 2, and the bit lines 6 travel down the columns of the array on the opposite side of the memory elements 2. The structure in FIG. 2 is partially inverted for clarity purposes: digit lines 4 physically run underneath the MTJ elements 2 (at that side of the MTJ elements 2 oriented towards the substrate in which the transistor T is provided), and bit lines 6 physically run over the MTJ elements 2 (at that side of the MTJ elements 2 oriented away from the substrate in which the transistor T is provided). However, if drawn that way, the bit lines 6 would obscure the magnetoresistive elements 2, which are the more relevant parts of the an MRAM.

MTJ memory elements 2 are layered structures generally including, as represented in FIG. 2, a non-magnetic conductor forming a lower electrical contact 22, a fixed or pinned magnetic layer 10, a dielectric barrier layer 14 positioned on the pinned layer 10, and a free magnetic layer 12 positioned on a dielectric barrier layer 14, with an upper contact 16 on the free magnetic layer 12. The pinned magnetic layer 10 and the free magnetic layer 12 may both be composed of e.g. NiFe, and the dielectric barrier layer 14 may e.g. be made of AlOx.

By applying a small voltage over the sandwich of ferromagnetic or ferrimagnetic layers 10, 12 with the dielectric 14 therebetween, electrons can tunnel through the dielectric barrier 14.

The pinned layer 10 of magnetic material has a magnetic vector that always points in the same direction. The magnetic vector of the free layer 12 is free, but constrained by the physical size of the layer, to point in either of two directions: parallel or anti-parallel with the magnetization direction of the pinned layer 10.

The memory element 2 is connected to the transistor T by means of an interconnect layer 16 and a plurality of metalization layers 18 and vias 20. There is a galvanic connection 22 between the memory element 2 and the bit line 6. The transistor T of each memory unit 1 is connected to a ground line 24.

Figure 3:
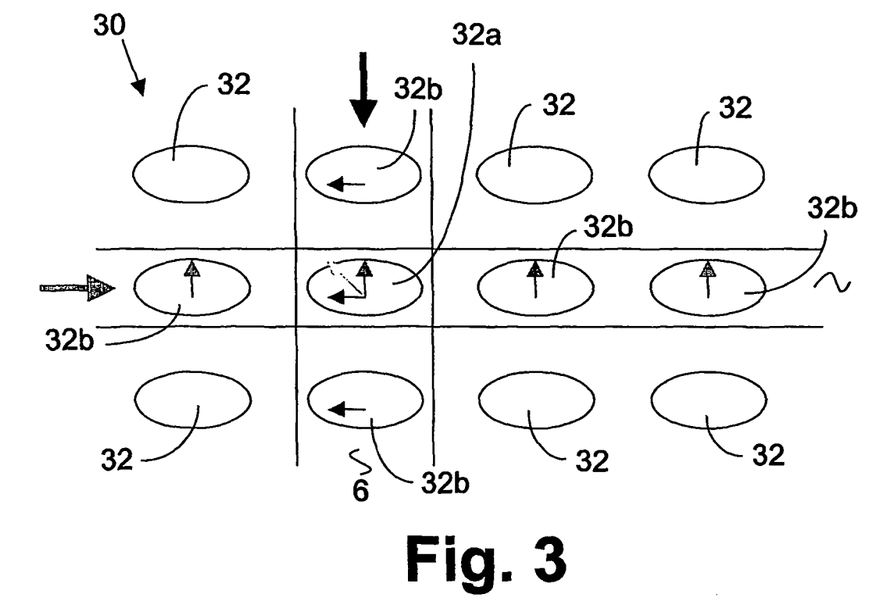
FIG. 3 illustrates a write operation on bit (2,2), which results in half-selects in elements in row 2 as well as in elements in column 2.

An MRAM array consisting of a 2-D matrix 30 of magnetic storage elements 32, 32a, 32b located at the intersections of two sets of orthogonal current lines, word lines 8 and bit lines 6, is schematically illustrated in FIG. 3. The array represented has a limited size, but in practice much larger sizes are possible.

In write or program mode, required currents flow through selected digit lines 4 and bit lines 6 so that at their intersection a peak magnetic field is generated, sufficient to switch e.g. the polarization of the free layer 12 of the MTJ element 32a, so as to switch the resistance of the MTJ unit 32a from the LoRes (low resistance) state to the HiRes (high resistance) state or vice versa (depending on the direction of the current through the bit line 6). At the same time, the switching element such as transistor T in the selected memory unit 1 (the memory unit at the intersection of the selected digit line 4 and the selected bit line 6) is in the cut-off state, for example by keeping the voltage on the word line 8 low (0 volt in case the switching element is a transistor T). The currents in the selected digit line 4 and the selected bit line 6 are such that together they provide a magnetic field able to change the direction of the magnetic vector of the free layer of the selected memory element, but the current in either strip by itself is not able to change the storage state. Therefore only the selected memory element 32a is written, not any of the other memory elements 32b on the same selected digit line 4 or bit line 6.

Upon switching of the elements 32, two orthogonal current lines 4, 6 are used to create an in-plane magnetic field vector, whose amplitude is maximal at a selected bit 32a. However, both field components may be influencing other magnetic elements 32b along the selected current lines 4, 6 (FIG. 3). This event is generally called 'half-select', and is responsible for the accelerated relaxation of (non-selected) magnetic bits 32b. During a write operation the energy barrier against thermal relaxation of all bits 32b influenced by a half-select is lowered considerably. Therefore, for an embedded MRAM memory, in which read and write operations occur with similar high frequency, the accumulated half-select time will define the expected thermal relaxation time, i.e., for a reduced energy barrier. On the other hand, for write-few read-many (WORM) type of MRAM, the thermal stability may rather be set by the super-paramagnetic limit for magnetic islands.

Due to the possible reduction of the energy barrier during a half-select, data retention or thermal stability of magnetic bits in an CAM is a key issue, which becomes more stringent for smaller elements, i.e. higher density. Two obvious solutions would be (1) to increase the aspect ratio of the element (shape anisotropy), which would result in higher switching fields, hence higher power consumption (~R.I$^2$), or (2) to increase the size of the elements for equal aspect ratio, which would result in a smaller memory density, hence larger memories. None of these solutions is acceptable in view of the requirements of maximizing data capacity and minimizing power consumption.

The thermally-activated switching or relaxation time $t_S$ can be estimated using the relation $$t_s = \tau_0 \exp\left(\frac{\Delta - \Delta E_{HS}}{k_B T}\right)$$

wherein $t_0$ relates to the attempt frequency (v~$10^9$ Hz); and $\Delta$ is the intrinsic energy barrier against thermal relaxation, which is lowered by $\Delta E_{HS}$ due to the presence of a half-select field.

Figure 4:
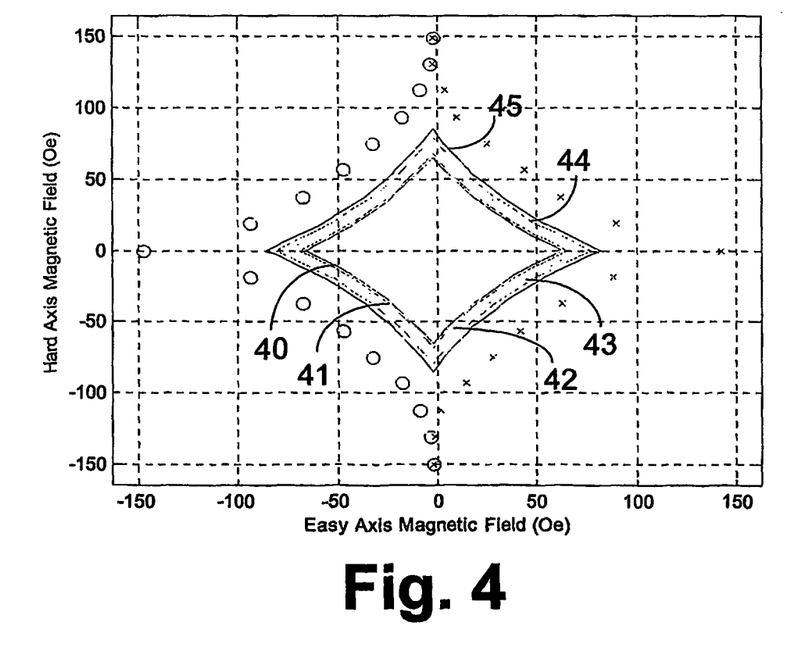
FIG. 4 illustrates curves, in function of different switching speeds, of stability regions for a 240×120 nm$^2$ MRAM element when applying magnetic fields along the hard axis and/or the easy axis of the MRAM element.
Figure 5:
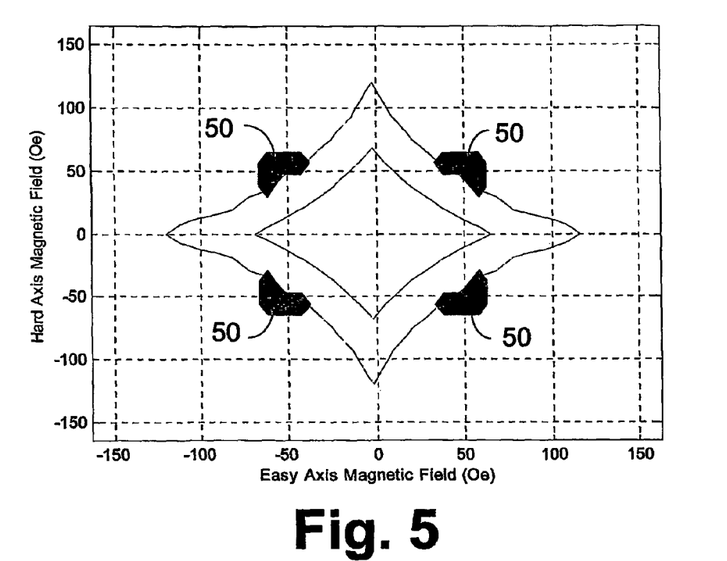
FIG. 5 illustrates a stable write field window for a 240×120 nm$^2$ MRAM element.

In FIG. 4, this relaxation time was calculated for a 240×120 nm$^2$ elliptic MRAM element with a 4 nm NiFe free layer. A typical astroid curve is obtained (symbols O and X, calculated at 0 K), also called a Stoner-Wohlfarth astroid. This curve is contrasted with different stability criteria The solid curves 40, 41, 42, 43, 44, 45 trace the boundaries of stability for a single idealized particle for magnetization pointing either left or right as a function of applied magnetic field. The axes of the plot correspond to the easy and hard axis field, i.e. parallel or perpendicular to the direction preferred by the crystalline anisotropy. The area within the different solid curves 40, 41, 42, 43, 44, 45 represent the fields which can be applied to non-selected bits in order to preserve thermal stability for times of respectively 1 second, 1 minute, 1 hour, 1 day, 1 month, and 1 year. It is to be noticed that a data retention specification of $10^{15}$ read/write cycles corresponds to an effective time of ~3½ months for a 10 nano-second half-select pulse time. This stability requirement results in a stable write field window as shown in the dark regions 50 in FIG. 5. Each point in these dark regions 50 shows a combination of magnetic fields according to the easy axis and according to the hard axis, which can be used to write a memory element, and which are such that each magnetic field separately (according to the hard axis or according to the easy axis) is not sufficient to switch a memory element.

The thermal stability requirement is strongly affected by the switching field distribution resulting from variations in shape and geometry of the magnetic elements (lithography, edge roughness and micromagnetism), as well as from distributions in the generation of on-chip magnetic fields. Tolerances or margins have to be set to overcome these process variations. On the other hand, due to the exponential relationship, these small changes are very important in the thermal stability analysis, as can clearly be seen in FIG. 4.

According to an embodiment of the present invention, a magnetic relaxation simulator is provided with an array of memory elements for storing data. The simulator may be used to estimate when the memory elements storing data need to be refreshed. The simulator may comprise reference magnetic elements or bits with a range of sizes smaller than the minimum size used for actual data storage. This is in order to reflect the statistical distribution in sizes and physical characteristics of the actual memory elements and associated field sources. In addition, an array of elements with different sizes may be included in order to obtain a more accurate impression of the thermal stability, which is a strong function of volume, and hence size for fixed layer thickness. By probing elements with different sizes, the decay can be monitored and adequate countermeasures can be taken. For the example given, this means that the MRAM does not only contain memory elements 2, but also an array of reference memory elements. A reference memory element or bit has dimensions such that its magnetization will relax in a shorter time than the minimum expected relaxation time of the storage elements 2 or bits. This can be such that either the area, or the aspect ratio, or both, of the reference elements is different from the area, or the aspect ratio, or both, of the actual memory elements.

Probing of the magnetization, or thus of the stored content, of the reference elements or bits allows the detection of the probable onset of magnetization relaxation in the storage elements 2 or bits, therefore signaling that the rewriting (re-magnetizing) of the storage elements 2 or bits is necessary. Such a scheme can be organized over rows, columns, or sectors.

Different embodiments can lead to different test strategies, merely depending on the nature of the test itself. One has to be able to make a difference between possible thermal stability problems due to write operations, or more general problems due to the influence of temperature or magnetic field.

In the case of a test structure for the whole chip, one may check for a possible ambient influence like temperature or magnetic field, at regular intervals during operation, or e.g. when booting a system. Based on the output of the test, the whole memory can be declared to be corrupted, e.g. remagnetized in too high a field, or totally random in too high a temperature. The test structure can be a temperature and/or field monitoring unit by itself, or be combined with one. If a back-up is present, the memory can be re-set. In this case, it may be important to have back-ups at regular intervals. If the test points out that part of the memory is possibly corrupted, then (that part of) the memory can be rewritten.

Figure 6:
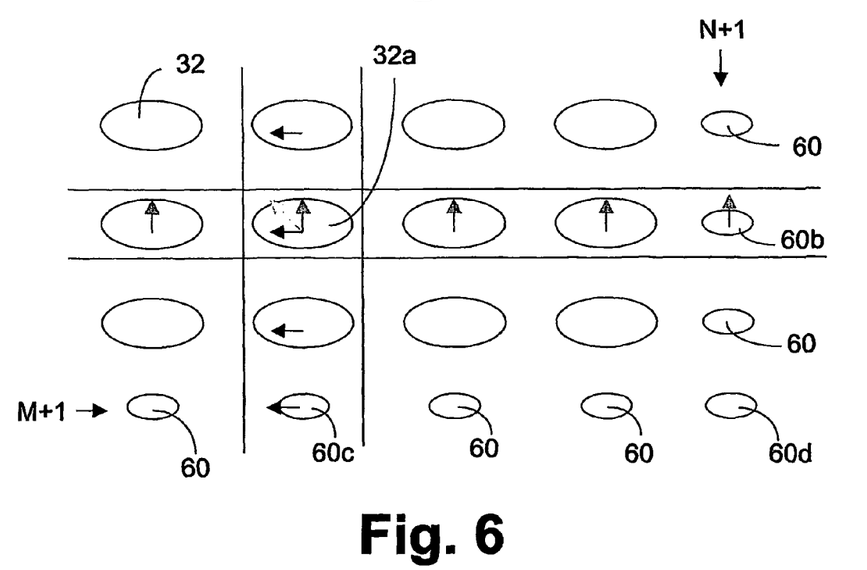
FIG. 6 illustrates a memory block provided with an extra row and an extra column of reference memory elements, according to an embodiment of the present invention.

Pre-set reference elements can be implemented in the memory array in various ways. Preferred embodiments include the possibility to check for half-select operations on both logic '0' and '1' states, as one of the currents, i.e. the bit current in line 6 in FIG. 3, can be applied bi-directionally. One option would be to simply add extra rows 0 and/or M+1, and columns 0 and/or N+1, for an M×N memory block, as illustrated in the embodiment of FIG. 6, wherein these extra rows and columns consist of reference memory elements 60, 60b, 60c, 60d with dimensions such that their magnetization will relax in a shorter time than the minimum expected relaxation time of the storage elements or bits 32, 32a, 32b. In the example given in FIG. 6, the reference elements 60, 60b, 60c, 60d have a smaller area than the actual memory elements 32, 32a, 32b. When programming memory element 32a, a peak magnetic field is applied to memory element 32a, a first partial magnetic field is applied to all memory elements 32b on the same row as target memory element 32a, and a second partial magnetic field is applied to all memory elements 32b on the same column as target memory element 32a In particular the first partial magnetic field is applied to reference element 60b, and the second partial magnetic field is applied to reference element 60c. The first and second partial magnetic fields are such that their combined effect generates a magnetic field, which is sufficient to switch memory element 32a, but each individual magnetic field is not sufficient to switch any of the memory elements 32b. The magnetization of the reference elements 60, 60b, 60c is probed according to a schedule that may be pre-programmed, or adapted, in accordance with the known physical properties of the magnetic elements or bits, the previous behavior of the simulator, a virtual simulator running within the data storage device, or a detailed virtual simulator running separate to the data storage device. A very simple schedule may dictate probing the reference elements after every write or read operation, or after a pre-defined number of write or read operations. When magnetization relaxation of one of the reference elements 60, 60b, 60c is detected, the whole memory content or part of it is re-written. This way, no unnecessary re-writing operations are carried out, thus limiting power consumption and memory down time. In the case of MRAM, for normal operation, thermal stability is mainly an issue during write operations, which is a very local operation, since at that moment only bits along the programming bit and digit lines have a lowered energy barrier against thermally-assisted switching. In principle, test elements on these lines are sufficient to monitor the possibility of unwanted switching in these neighboring elements. In this case, a positive test would result in rewriting all of the neighboring elements. In the case of e.g. a word-parallel writing strategy, this means that a whole memory block should be rewritten.

Figure 7:
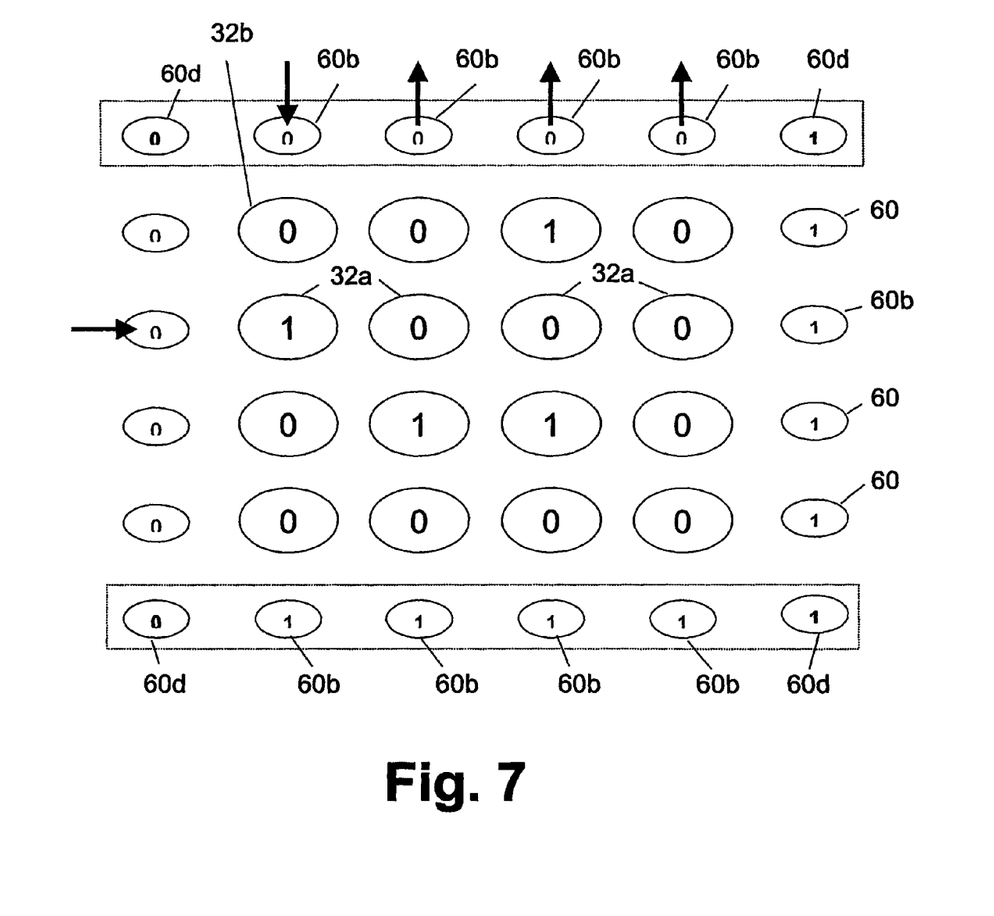
FIG. 7 illustrates a memory block provided with two extra rows and two extra columns of reference memory elements, according to an embodiment of the present invention.

A straightforward solution would be to add two test-cells, with logic 0 and 1 value, in each row and/or column, as represented in FIG. 7. The thermal stability test would be to compare both values in the selected lines after every write operation, or, e.g. statistically distributed in the matrix, over every few write operations. If the resistance difference ΔR between both states is too small, then either test-0 become test-1 or vice versa. In any case, one of the states is changed, which detects the likely onset of thermal relaxation in the matrix. It is to be noted that due to the different size, comparison to standard elements is not possible. Therefore, e.g. at the corners, specific standard elements for reference, which are not or hardly exposed to on-chip fields, can be pre-programmed.

After a write-operation, e.g. for the word 1000 (2nd real-data row), the bit status of the reference elements on the left and right can be checked. If they give an error, the word can be either read and compared with the initial data that is still available, or it can simply be rewritten. On the other hand, if any of the reference bits on the reference rows has changed its bit status, then the likely onset of thermal relaxation is detected, and the whole matrix can be read and rewritten, after first resetting all reference bits.

According to an alternative embodiment, specific test structures comprising pre-set elements can be implemented in the memory architecture. The sole requirement is that on-chip currents or magnetic fields are influencing the reference elements in a similar fashion as functional bits.

More complicated test features can readily be implemented, based on the same idea, i.e. reference elements are added to detect the likely onset of thermal relaxation in the matrix.

Comparison with the thermal stability of reference elements with a smaller aspect ratio, e.g. by keeping only one of the dimensions of the elements equal, provides a simple way to estimate this minimum requirement for the functional elements in the array. Moreover, using this method one can possibly live with larger process variations, due to the possibility for an improved write window. Regular checking of the initial status of the reference elements for thermal stability then gives a go/no-go signal for re-writing the full array. Row, column or sector, depending on the organization of the reference elements.

In accordance with a further embodiment of the present invention the magnetic relaxation simulator may also be virtual in form, comprising a predictive model programmed into a processing element within or associated with the data storage device. The processor may be a microprocessor or an embedded processor core. The processor may also be a programmable gate array such as a Programmable Logic Array (PLA) or a Programmable Array Logic (PAL) or a Field Programmable Gate Array (FPGA). The simulation may be done by predicting the thermal relaxation of magnetic storage elements on the basis of an established relationship between the thermal relaxation of magnetic storage elements and physical processes that occur therein, such as magnetization switching due to writing of values. Preferably the model is of sufficient complexity to predict the actual behavior of a "hardware" simulator, i.e. a simulator with reference storage elements as described above. Obtaining that complexity may be dependent upon knowing the actual physical and operational characteristics of the storage magnetic elements or bits to a sufficient level of accuracy as initial input data for the model. In addition, the model may have to be structured in such a way as to simulate the physical processes that occur within a "hardware" simulator to a very high level of accuracy. Such a virtual simulator may require a large processing overhead, or extremely fast processing infrastructure in order to run in "real time". Such requirements may be relaxed if a simplified model is used to simulate the "hardware" simulator with sufficient accuracy to be used in practice.

As an alternative, an extremely accurate virtual simulator can be run "off-line", not in real time, and the results can be stored in the data storage device in such a way as to be accessible by the device in order to control the operation of the device.

A virtual simulator can also be used in tandem with a hardware simulator within the data storage device. A further variation is to use a hardware simulator in combination with the results of a more complex virtual simulator, that have been stored in an accessible manner within the data storage device.

A further embodiment of a simulator according to the present invention may for example be applied in hard disk based data storage systems.

Figure 8:
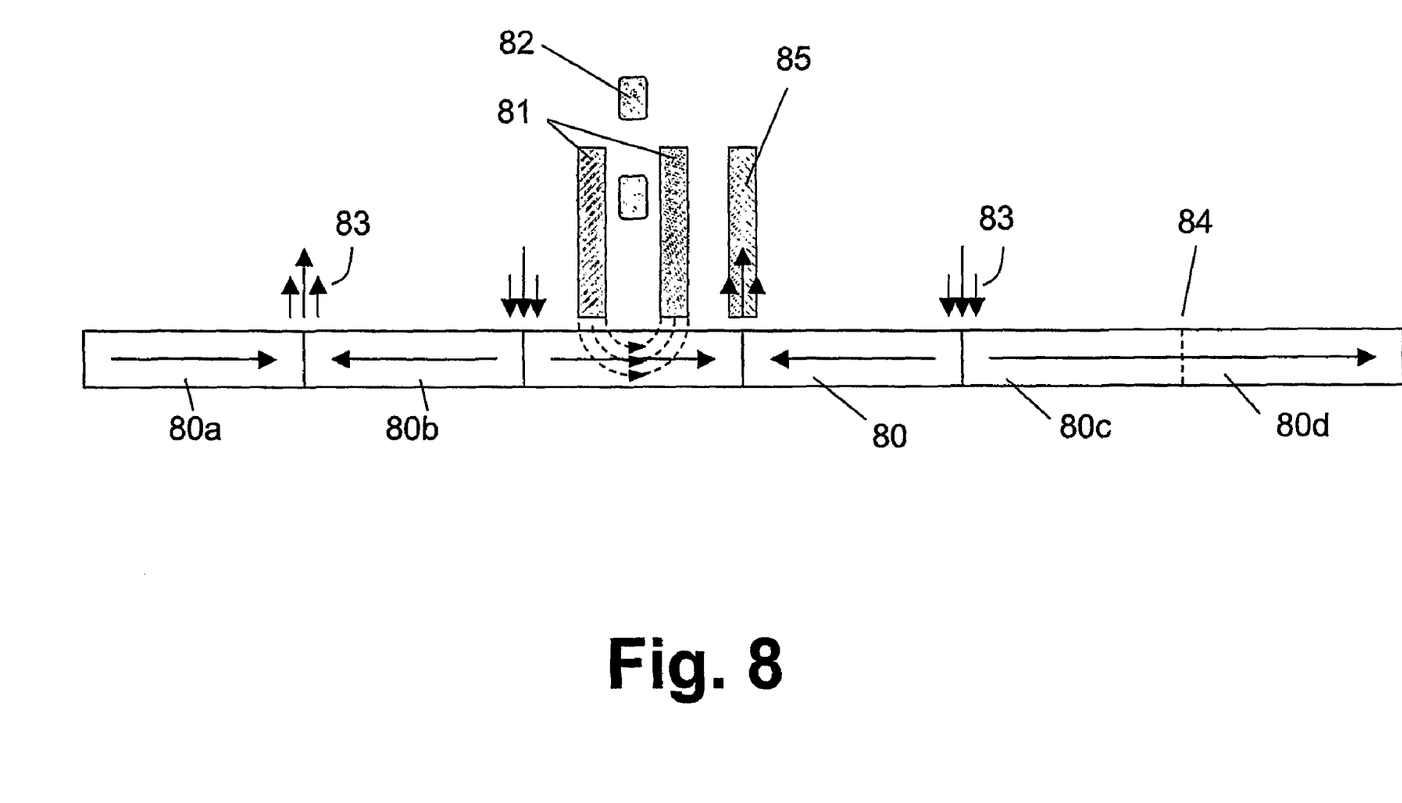
FIG. 8 illustrates a write process in a hard disk drive.

The write process in hard disk drives consists of magnetizing areas or domains 80, 80a, 80b, 80c, 80d along narrow circumferential tracks within the media with an externally applied magnetic field (see FIG. 8). The externally applied magnetic field may be generated by means of write head poles 81 and a write head coil 82. The direction of the magnetic field defines the magnetization of the domain 80, 80a, 80b, 80c, 80d to be written. The data to be written is encoded such that a transition 83 between two oppositely magnetized domains

80a, 80b corresponds to a first binary state, e.g. "1", and the absence of a transition 84 between two domains 80c, 80d magnetized in the same direction corresponds to a second binary state, e.g. "0", or vice versa. An external clock is used as a reference for defining the location of transitions "1s" or absent transitions "0s". Read-back is accomplished by detecting the presence 83 or absence 84 of transitions, which for the case of magnetic media magnetized in the plane of the disk, corresponds to detecting the vertical components of stray magnetic field that emanate from transitions. At present GMR sensors 85 mounted in flying heads (not represented) are used for bit detection.

Figure 9:
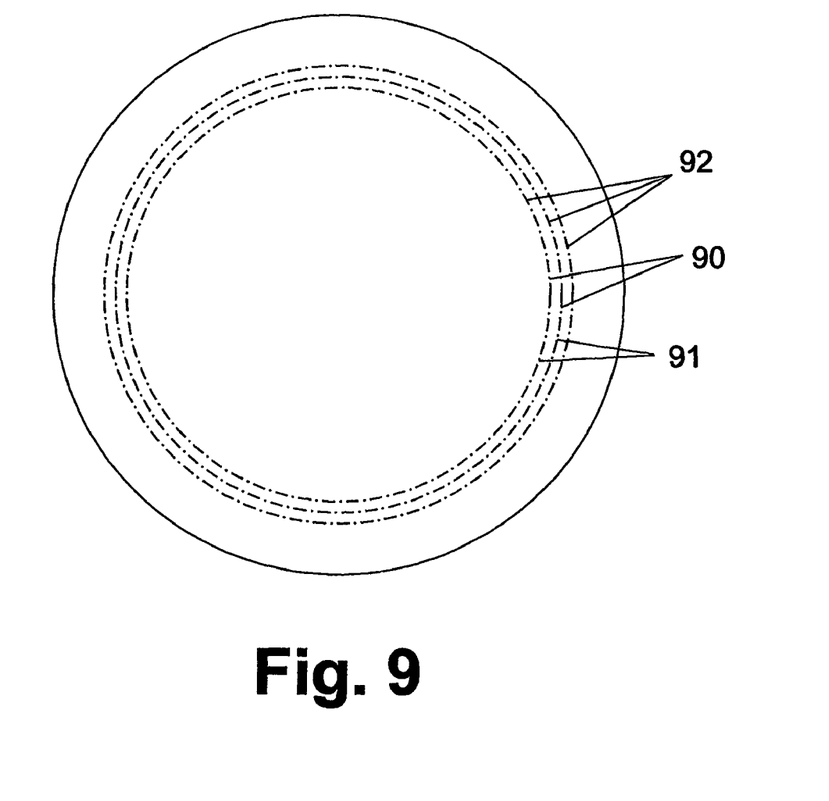
FIG. 9 is a top view of a hard disk drive.

Hard disk drives make use of servo information embedded in special header sub-sections 90 of data found at the beginning of subdivisions of data known as sectors 91 (see FIG. 9). These headers 90 are used to assist in the following of tracks 92 by the flying head (not represented), the identification of the tracks 92 and also the identification of the sectors 91. Data files may be sub-divided between the physical sectors 91 found on the hard disk, or sectors 91 may contain several small data files.

The magnetic relaxation simulator according to an embodiment of the present invention may be realized in the hard disk media platter by writing a reference pattern of bits into a pre-defined area on the disk. Such areas may be embedded within the headers 90 of each sector 91, or in a separate area on each track 92, or within a single pre-defined track 91. The pattern of bits is structured such that it contains a series of oppositely magnetized domains, possessing initially well defined magnetic volumes and boundaries. The magnetic volumes should be chosen such that they suffer from detectable magnetic relaxation over time scales shorter than that for the magnetic volume defined by the minimum distance between transitions in areas containing stored data.

The reference bit pattern may consist of one or more equally sized magnetic volumes, or a range of magnetic volumes allowing a distribution of relaxation times to be probed.

Magnetic relaxation within the reference pattern may proceed by the random, thermally induced reversal of the magnetization of individual grains within each magnetic volume. This may result in the magnetic volume becoming "demagnetized" via the initially written magnetic domain splitting into equal numbers of unstable small magnetic volumes. This would result in the media exhibiting a larger background noise during read-back from the reference bits. Additionally, grains close to the boundaries between domains (transitions) may be more prone to reversal due to the added influence of the larger demagnetizing field that exists close to transitions. This may lead to the transitions between domains becoming less well defined and eventually "self-erasing". This would result in the read-back signal from transitions becoming noisier and eventually in the transition becoming undetectable.

Thus the magnetic relaxation of the reference bits may be probed by monitoring the background signal to noise ratio from the reference pattern, monitoring the transition noise from the reference pattern, or monitoring when the transitions in the reference pattern become impossible to detect.

The latter may be the preferred method as it allows individual transitions linked to pre-defined magnetic volumes of a certain size to be probed.

Figure 10:
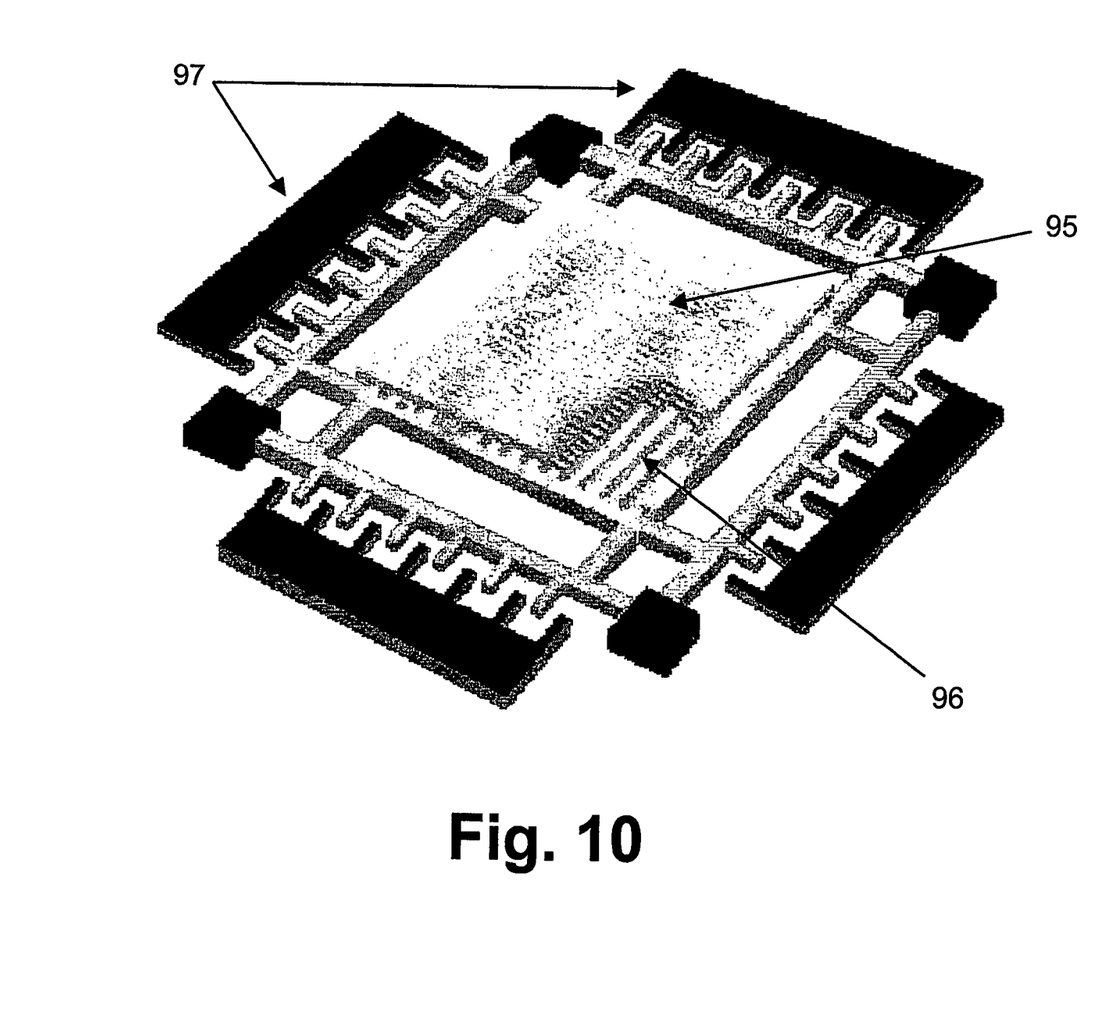
FIG. 10 is a partially broken away view of a probe based data storage device.

An embodiment of the simulator according to the present invention may for example also be applied in probe based data storage devices. An example of a probe based system is shown in FIG. 10. Such devices usually consist of an array 95 of probes manufactured using MEMS (micro-electromechanical systems) processes that are used to access data written into a separate media 96. In contrast to disk based systems where the media rotates about a central axis, in probe based systems the media 96 and probe array 95 move relative to each other in an XY raster pattern, actuated by actuators 97.

Probe based data storage devices may use continuous media reading, writing and coding methods similar to those described for hard disk based systems. Probe based systems may also use media patterned into individual elements, these elements possessing magnetizations perpendicular to the plane of the media 96. Similar to hard disks, data is written by aligning the magnetization of the elements with an externally applied magnetic field possessing the appropriate polarization. A first binary value, e.g. "1", may be represented by an element whose magnetization is aligned away from the media plane towards the probe array, and a second binary value, e.g. "0", by an element whose magnetization is aligned in the reverse direction. Reading is performed by detecting the direction of the magnetization of the individual magnetic elements via the interaction of an individual probe with an individual magnetic element. This may be done by detecting the direction of the stray magnetic field, which is directly related to the direction of the magnetization of the bit, emanating from the magnetic elements. Several methods exist by which the direction of the stray field can be probed, including the use of GMR or TMR sensors mounted on the probes, or the monitoring of the deflection of a permanently magnetized probe when interacting with the stray magnetic field from an element.

A magnetization relaxation simulator according to an embodiment of the present invention may be realized in a probe based data storage device incorporating patterned media 96 in the following way. During the media manufacturing process, arrays of equally sized elements are patterned in order to form individual bit locations for the storage of data. The simulator is realized by defining areas on the media 96 where an element or group of elements possess dimensions (magnetic volumes) smaller than those of the data storage elements. The size of the reference element(s) is such that their magnetization relaxes in a time shorter than that for the data elements. The magnetic relaxation of the reference element(s) is detected by comparing their magnetization at some pre-defined time, with their initial pre-defined magnetization. Any mismatch between the two will reveal that the magnetization in the reference element(s) has relaxed due to random thermal fluctuations and that the information stored in the data elements should be refreshed.

Reference elements may be indexed to rows or columns of data elements, the reference magnetization being set at the time of writing information to the respective rows or columns. Thus the reference elements need not be located adjacent to their respective data elements, but do need to have their reference magnetizations set at the same time as any data is written.

Should the reference element(s) be located adjacent to data elements it may be convenient to place them in the header of any sector-like media sub-divisions.

The reference magnetizations of a group of reference elements may be defined to form a certain pattern of elements with parallel and anti-parallel magnetizations. The reference elements may form groups of elements, each group containing elements with a distribution of sizes (magnetic volumes) and hence a distribution in magnetic relaxation times. By monitoring the progress of magnetization relaxation as a function of element size, predictive control of the refreshing of bit elements may be implemented.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. Magnetic memory device comprising an array of magnetic storage elements for data storage, the memory being furthermore provided with a magnetic relaxation simulator for simulating the onset of thermal relaxation of the magnetic storage elements.

2. Magnetic memory device according to claim 1, wherein the simulator comprises at least one element or an array of elements of reference magnetic storage elements for detecting the onset of thermal relaxation of the magnetic storage elements.

3. Magnetic memory device according to claim 2, each storage element having a magnetic volume, wherein the reference magnetic storage elements have a magnetic volume smaller than the minimum magnetic volume used for actual data storage.

4. Magnetic memory device according to claim 3, wherein the magnetic volume of a storage or reference element relates to its aspect ratio.

5. Magnetic memory device according to claim 3, wherein the magnetic volume of a storage or reference element relates to its area.

6. Magnetic memory device according to claim 1, wherein the simulator comprises a processing element containing a predictive model of the thermal relaxation of magnetic storage elements.

7. Magnetic memory device according to claim 1, wherein the memory is a magnetic data storage device.

8. Magnetic memory device according to claim 1, wherein the magnetic storage elements or reference are contained within a continuous thin film of magnetic material.

9. Magnetic memory device according to claim 1, wherein the magnetic storage or reference elements are defined by a continuous thin film of magnetic material that has been patterned into individual elements.

10. Magnetic memory device according to claim 1, wherein the magnetic storage or reference elements are defined by the forming of individual magnetic elements within a pre-defined patterned structure.

11. A magnetic memory arrangement comprising:
an actual magnetic storage element to store data, and
a simulation magnetic storage element to store data, the simulation magnetic element being arranged to exhibit an operational condition to simulate an operational condition of the actual magnetic storage element.

12. The arrangement of claim 11, wherein the simulation magnetic storage element is adapted to exhibit an operational condition to simulate the onset of thermal relaxation of the actual magnetic storage element.

13. The arrangement of claim 11, wherein the simulation magnetic storage element is adapted to exhibit an operational condition by exhibiting a failure condition, prior to the actual magnetic storage element failing, to provide a warning of the failure of the actual magnetic storage element prior to actual failure.

14. The arrangement of claim 11, wherein the simulation magnetic storage element has a magnetic volume that is less than the magnetic volume of the actual magnetic storage element to facilitate the onset of an operational condition at the simulation magnetic storage element before the onset of said condition at the actual magnetic storage element.

15. The arrangement of claim 11, wherein the simulation magnetic storage element includes a processing element containing a predictive model of the thermal relaxation of actual magnetic storage element to exhibit a thermal relaxation condition of the actual magnetic storage element.

* * * * *